(12) United States Patent
Pansier

(10) Patent No.: US 8,670,220 B2
(45) Date of Patent: Mar. 11, 2014

(54) PROTECTION CIRCUIT FOR A CASCODE SWITCH, AND A METHOD OF PROTECTING A CASCODE SWITCH

(71) Applicant: NXP B.V., Eindhoven (NL)

(72) Inventor: Frans Pansier, Nuenen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/870,255

(22) Filed: Apr. 25, 2013

(65) Prior Publication Data

US 2013/0301176 A1  Nov. 14, 2013

(30) Foreign Application Priority Data

May 9, 2012 (EP) .................................... 12167275

(51) Int. Cl.
*H02H 3/00* (2006.01)
(52) U.S. Cl.
USPC .............................................................. 361/86
(58) Field of Classification Search
USPC .............................................................. 361/86
See application file for complete search history.

(56) References Cited

U.S. PATENT DOCUMENTS 6,614,281 B1   9/2003   Baudelot et al.
7,382,591 B2 * 6/2008   Han et al. ..................... 361/56
2002/0105309 A1   8/2002   Rutter et al.
2006/0164057 A1   7/2006   Kudo et al.
2007/0228416 A1   10/2007   Chen et al.
2008/0205100 A1   8/2008   Sakamoto
2010/0117095 A1   5/2010   Zhang
2011/0018002 A1   1/2011   Chen et al.

FOREIGN PATENT DOCUMENTS

DE   103 10 578 B3   6/2004

OTHER PUBLICATIONS

Extended European Search Report for European Patent Appln. No. 12167275.2 (Aug. 30, 2012).

* cited by examiner

*Primary Examiner* — Stephen W Jackson

(57) ABSTRACT

A circuit arrangement is disclosed comprising: a normally-on transistor (such as a HEMT) having first and second transistor main terminals and a non-insulated control terminal, the non-insulated control terminal being electrically coupled to a ground; a normally-off switch having first and second switch main terminals and a switch control terminal, the normally-off switch being arranged in a cascode configuration with the normally-on transistor, the first switch main terminal being electrically coupled to the second transistor main terminal, the switch control terminal being electrically coupled to the second switch main terminal and to the ground; and a control circuit configured to switch on the normally-off switch in response to the voltage at the first switch main terminal being negative relative to the ground.

A method of controlling such a circuit is also disclosed.

11 Claims, 3 Drawing Sheets

PROTECTION CIRCUIT FOR A CASCODE SWITCH, AND A METHOD OF PROTECTING A CASCODE SWITCH

CROSS-REFERENCE TO RELATED APPLICATIONS

This application claims the priority under 35 U.S.C. §119 of European patent application no. 12167275.2, filed on May 9, 2012, the contents of which are incorporated by reference herein.

FIELD OF THE INVENTION

This invention relates to circuit arrangements for cascade switches, and to methods of operating cascade switches.

BACKGROUND OF THE INVENTION

Recent improvement in the cost on performance of wide band gap semiconductor devices, and GaN HEMT in particular, are making such devices increasingly attractive in high power applications, due to their fast switching and relatively low losses. One example of such high power applications is switch mode power supplies (SMPS).

However the technology with the lowest Rdson and the easiest to manufacture is a normally on HEMT with Schottky gate. In many applications however a normally off switch is needed. This can be made by adding a normal Si-FET between source and gate, in a cascade configuration, such as is known for instance from United States patent application publication number US 2010/0117095. Such an arrangement is shown in FIG. 1 which depicts a cascade configuration 10 comprising a HEMT 12 with its gate connected to a ground 16. The source of HEMT 12 is also connected to ground, by means of a FET 14. That is to say, the FET 14 is connected by its two main terminals in series between the source of the HEMT and ground 16, and in particular the drain of the FET 14 is connected to the source of the HEMT and the source of the FET 14 is connected to the ground. The cascade arrangement is controlled by means of the control terminal 18, that is to say the gate, of the FET.

Precautions have to be made for preventing large currents through the gate of the HEMT, as this gate is vulnerable. It is known to provide gate protection measures for HEMTs, for instance as disclosed in United States patent application publication number US 2007/0228416. Another technique, disclosed in the U.S. Pat. No. 6,614,281 involves disconnecting a cascade circuit with voltage controlled semiconductor switches, in such a way that the gate voltage of a low-blocking-capability semiconductor switches controlled in such a way that its drain voltage is held constant in the active region of the low-blocking-capability semiconductor switch. However, measures that influence the gate have disadvantages, not only due the additional component count, but also have negative impact on the performance, such as reduced switching speed, and the like. It would be beneficial to reduce or eliminate these drawbacks.

SUMMARY OF THE INVENTION

According to a first aspect there is provided A circuit arrangement comprising: a normally-on transistor having first and second transistor main terminals and a non-insulated control terminal, the non-insulated control terminal being electrically coupled to a ground; a normally-off switch having first and second switch main terminals and a switch control terminal, the normally-off switch being arranged in a cascade configuration with the high electron mobility transistor, the first switch main terminal being electrically coupled to the second transistor main terminal, the second switch main terminal being electrically coupled to the ground; and a control circuit configured to switch on the normally-off switch in response to the voltage at the first switch main terminal being negative relative to the ground. By closing the normally-off switch, that is to say by switching it on, the resistance of the current path through the normally-off switch is greatly reduced relative to the resistance of the current path through the gate of the high electron mobility transistor, thereby greatly reducing the current through the gate of the high electron mobility transistor. Protection means for the gate may therefore not be required, or may only be required to a lesser extent than heretofore In embodiments, the control circuit comprises a detector and an actuator, the detector begin for detecting the voltage at the first switch main terminal relative to the ground, and the actuator being to provide a control signal to the switch control terminal to turn on the normally-off switch in response to the detector detecting that the voltage at the first switch main terminal is negative relative to the ground. The detector may take the form of a comparator, and the actuator may take the form of a control signal output from the comparator.

In embodiments, the control circuit is configured to switch on the normally-off switch in response to the voltage at the second transistor main terminal being negative relative to the ground. In other embodiments the control circuit is configured to switch on the normally-off switch in response to the voltage at the first transistor main terminal being negative relative to the ground.

In embodiments, the circuit arrangement, further comprises a logic circuit arranged to provide a signal to the switch control terminal, the signal being a logical 'OR' of the control signal and a periodic drive signal. In embodiments, the circuit is configured for use in a switch mode power supply, wherein the periodic drive signal controls the switch mode power supply.

In embodiments, the normally-on transistor is a normally-on GaN high electron mobility transistor. In embodiments of the normally off switch is a field effect transistor According to another aspect there is provided a protection circuit for a normally-on transistor in a cascade configuration with a normally off switch, the protection circuit comprising a detector for detecting if the drain of the switch is negative relative to its source; and a control element for switching on the switch in response to the detector detecting that the drain of the switch is negative relative to its source According to yet another aspect there is provided a method of controlling a cascade switch comprising: a normally-on transistor having first and second transistor main terminals and a non-insulated control terminal, the non-insulated control terminal being electrically coupled to a ground, and a normally-off switch having first and second switch main terminals and a switch control terminal, the normally-off switch being arranged in a cascade configuration with the normally-on transistor, the first switch main terminal being electrically coupled to the second transistor main terminal, the second switch main terminal being electrically coupled to the ground; the method comprising detecting whether the voltage at the first switch main terminal is negative relative to the ground, and switching on the normally-off switch in response to the voltage at the first switch main terminal being negative relative to the ground.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

DETAILED DESCRIPTION OF EMBODIMENTS

Figure 1:
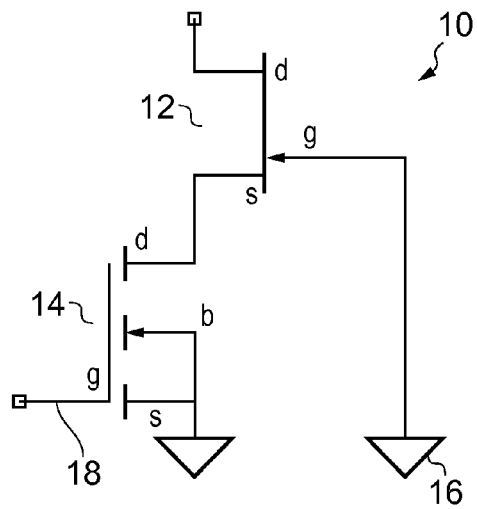
FIG. 1 shows a cascode arrangement of a HEMT and a FET.

As described above, a normally on HEMT, such as a GaN HEMT, can be made to operate in a normally off configuration by the addition of a FET in a cascade arrangement. In some applications, there are situations in which the current does not flow from drain to source of the HEMT, but needs to flow from source to drain. Seen from the drain of the HEMT there are two parallel paths for the current: one through the gate of the HEMT, one through the series connection of the channel of the HEMT in series with the body diode of the FET. Which path will be the path for the current will depend on the ratio of the net forward voltages of the two paths.

The gate of the HEMT can start conducting at around 0.7V, in a worst case. The body diode of the FET can have a forward voltage to well over 1 V, which would result in the current flowing through the gate of the HEMT. Such current could destroy the gate structure of the HEMT. Whereas it is known to provide protective circuits to protect the gate of the HEMT, according to embodiments the situation is prevented from arising at all, by actively by actively switching on the FET, which reduces the voltage drop across the FET to I*Rdson, (where I is the current through the FET and Rdson is its drain-source resistance in the on-state. Since the FET can be a low voltage FET, the value of Rds-on can be very small even for low cost devices.

As non-limiting examples of an implementation in which a current is required to flow from source to drain, consider a boundary conduction mode (BCM) boost power factor control (PFC) circuit, and a quasi-resonant flyback circuit. In such circuits the switch is switched on for a certain period of time, Ton. During Ton, respectively the current through the coil (for the boost circuit), or the primary winding of the transformer, (for the quasi-resonant flyback circuit), increases to the required level. After Ton has elapsed, the switch is switched off. The voltage across the switch increases until, respectively, the value of the output voltage has been reached, or it reaches Vin+N.Vout, (where N is the turns ratio of the transformer). Then the output diode starts to conduct. The current through the diode gradually decreases to 0. At the instance that the diode stop conducting, a ringing starts. This is due to the fact that there will always be a capacitance at the drain node, which can oscillate with the inductance of the coil or transformer. The lowest value of the voltage, when only the two ringing components are taken into account, will be Vout−2*Vin (in case of a PFC) or Vin−N*Vout (in case of a flyback).

Depending on the values of the voltages Vin, Vout or N*Vout, this value can be negative. Common switches will clamp this voltage to ground. However: this clamping occurs by virtue of the fact that they can conduct current in the reverse direction. In circuits in which the power switch is a single conventional normally-off MOSFET this is caused by the internal body diode However, in the case of a cascaded Schottky gate GaN HEMT, in which the HEMT gate is connected to ground to improve the switching performance, the situation is different:

Given the (lateral) structure of the HEMT, the channel resistance is almost completely between the gate and drain connections. So effectively the gate Schottky diode is in parallel to the body diode of the FET, so the behaviour with respect to negative current can be adequately modeled as a regular MOSFET and a Schottky diode (from the HEMT gate-source) in parallel. This is shown in FIG. 2, which also includes a simple model of a PFC.

Figure 2:
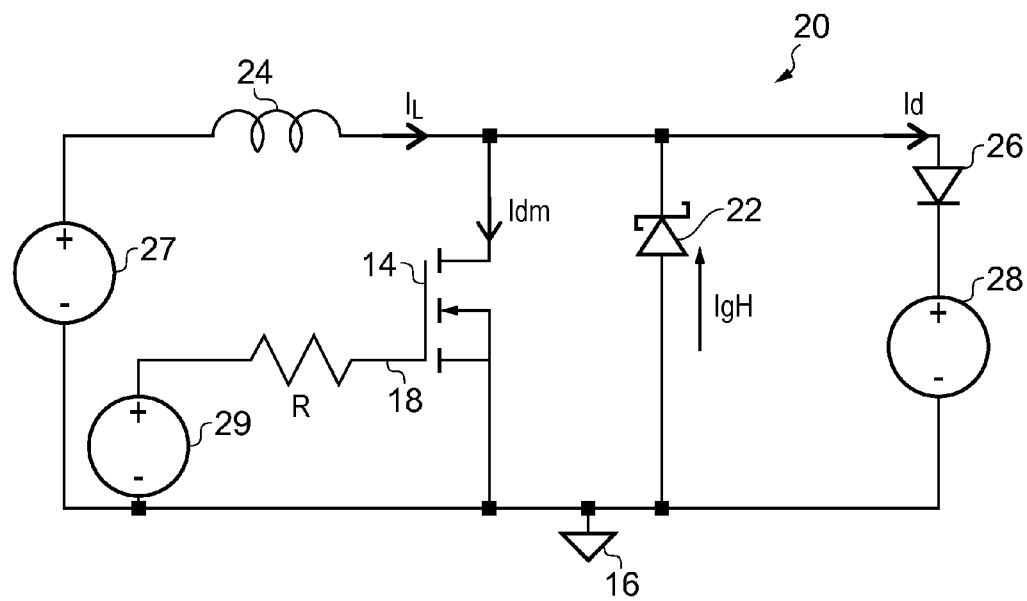
FIG. 2 shows a simplified model of the PFC with a cascaded switch.

FIG. 2 shows a model of a PFC, during the ringing at the end of the switching cycle, comprising a coil 24 and an output diode 26, for converting an input voltage 27 to an output voltage 28. The cascode switch arrangement is modeled by MOSFET 14 in parallel with Schottky diode 22 representing the body diode of the HEMT, both connected to the ground 16. The gate control terminal of the MOSFET is supplied with a periodic drive voltage 29 through a resistor R.

Figure 3:
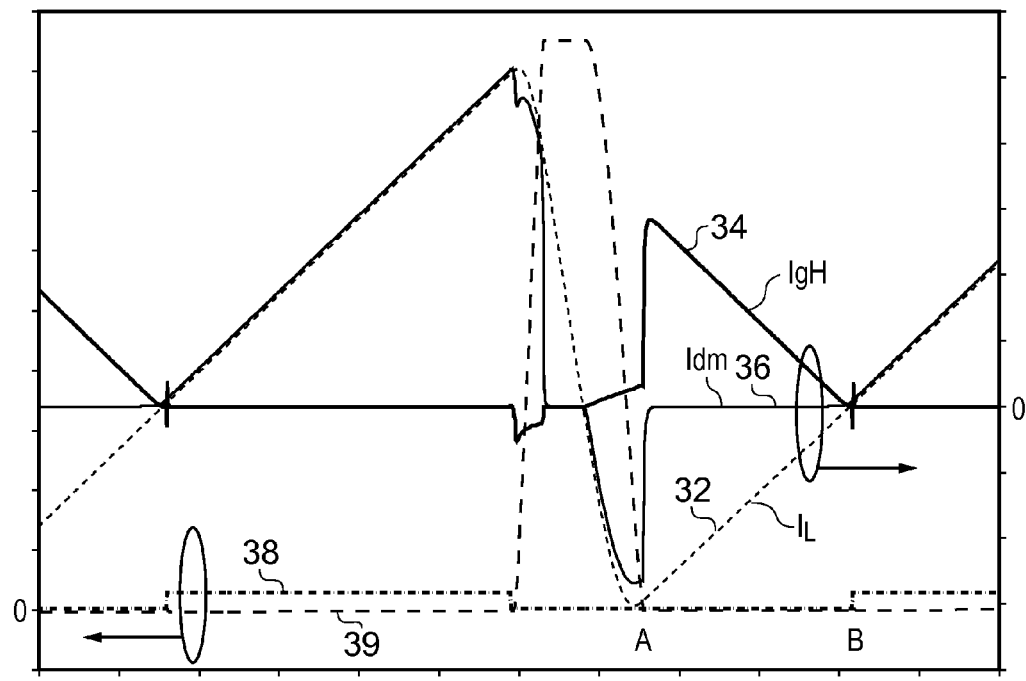
FIG. 3 shows waveforms associated with the circuit of FIG. 2.

Waveforms associated with the model shown in FIG. 2 are depicted in FIG. 3, currents plotted against the right-hand y-axis or ordinate and voltages plotted against the left-hand y-axis or ordinate, against time on the abscissa or x-axis. In particular FIG. 3 shows at 32, the coil current $I_L$, and at 34 the current IgH through the Schottky gate of the HEMT. The drain current Idm of the MOSFET is shown at 36. The voltages are the drive voltage 38 of the FET and the voltage 39 across the switch.

The effect during a full switching cycle can be understood as follows: During the Ton the current through the PFC coil increases linearly, then after switch off the voltage rises rapidly, causing also a—limited—capacitive current in the Schottky gate. During the time that the voltage is clamped by the output voltage, the coil current decrease fast to zero. Afterwards a ringing starts, driving the drain voltage to zero. When the voltage has dropped to zero, shown at A in FIG. 3, the coil current 32 has quite a large negative value. This current then starts to flow through the Schottky, and not through the body diode of the FET. This negative current is the current that endangers the reliability of the gate structure of the HEMT, and must be prohibited as far as possible.

Only when the MOSFET is turned on again, to start the next cycle, shown at B in FIG. 3, current will flow through the FET.

According to embodiments, the FET is turned on earlier.

According to embodiments, in order to switch the FET on, a comparator is be added, that switches the FET whenever the voltage has dropped to zero, and keeps it on as long as the voltage remains below zero (i.e. as long as a negative current will flow). This condition can easily be detected, because there will always be a small negative value as long as a negative current flow, the amplitude being Ineg*Rdson.

A basic implementation according to embodiments implementation is the addition of a comparator, that checks whether the drain voltage is below zero or not, and outputs high whenever the voltage is negative. A resistor 45 connected to the supply rail (not shown) ensure that the output is determinate high or low, and is not allowed to float. The output of the comparator is then ORed with the control signal from the regular PFC (or flyback) controller.

Figure 4:
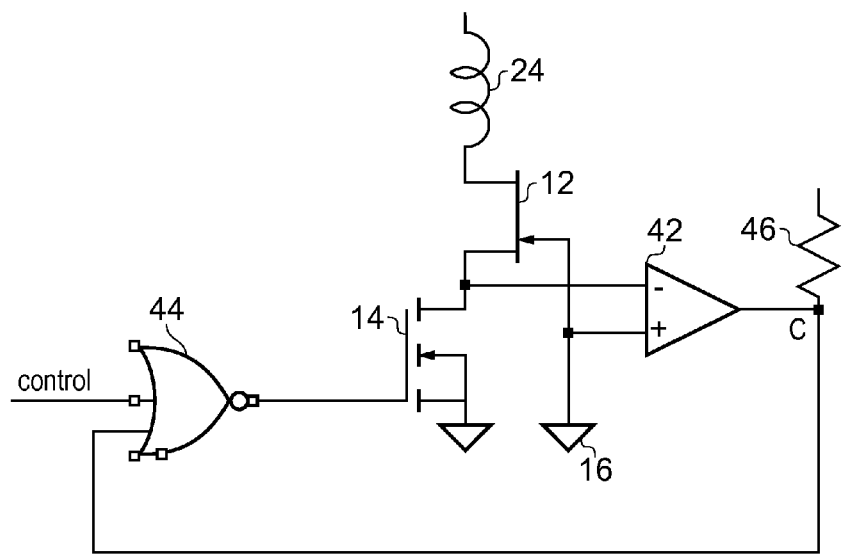
FIG. 4 shows a circuit arrangement according to embodiments.

Such an embodiment is shown in FIG. 4. This shows a cascode configuration of a MOSFET 14 and HEMT 12, the drain of which is connected to coil 24. The gate of the HEMT, which is connected to ground 16, is also connected to a first, positive, input of a comparator 42. The second negative input of the comparator is connected to the source of the HEMT, and so the output C of the comparator is positive whenever the source is negative with respect to the gate. In other words, whenever there would be a tendency for a negative current to flow through the gate, the comparator is high in order to force the MOSFET to an on-condition even outside the T-on part of the switching cycle; the output C is logically OR'ed with the control signal to effect this by means of OR logic 44.

Figure 5:
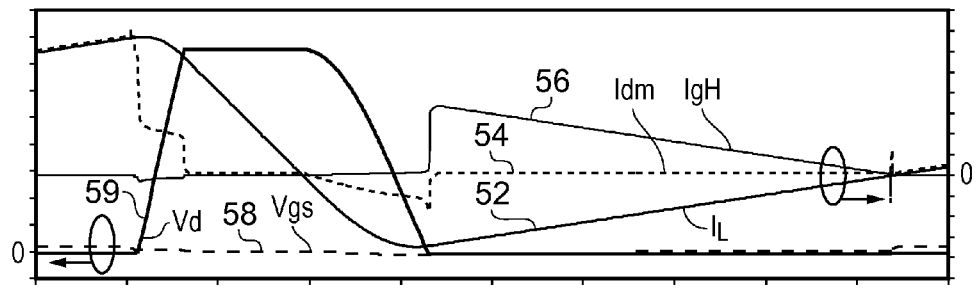
FIG. 5 shows waveforms associated with the circuit of FIG. 4 without the comparator operating.
Figure 6:
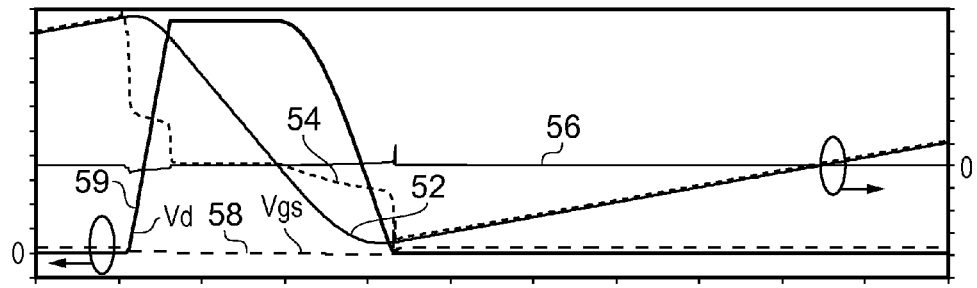
FIG. 6 shows waveforms associated with the circuit of FIG. 4 in operation

The effect of the comparator is shown in FIGS. 5 and 6. FIG. 5 shows waveforms of the circuit shown in FIG. 4 where the output C of the comparator 42 is not connected; FIG. 6 shows the corresponding waveforms where the output C of the comparator 42 is connected back to the control logic 44.

The current shown in FIGS. 5 and 6 are the coil current $I_L$ 52, the drain current $I_{dF}$ 54 of the FET, and the gate current $I_{gH}$ 56 of the HEMT. Also shown are the gate source voltage Vgs 58 of the FET drain voltage Vd 59 of the FET. It will be appreciated that the voltages and currents have been displaced slightly vertically, in order to more clearly distinguish respective voltages and current which overlap.

Shown in FIG. 5, if the FET is left open for the final part of the switching cycle after the coil current reaches its minimum, there is a significant and potentially damaging, positive current through the gate of the HEMT. In contrast, in the case of FIG. 6 where the FET is closed at this moment, thereby significantly reducing the impedance of the parallel path, the coil current is all routed through the FET and there is, apart from a small spike, no current through the HEMT gate.

Figure 7:
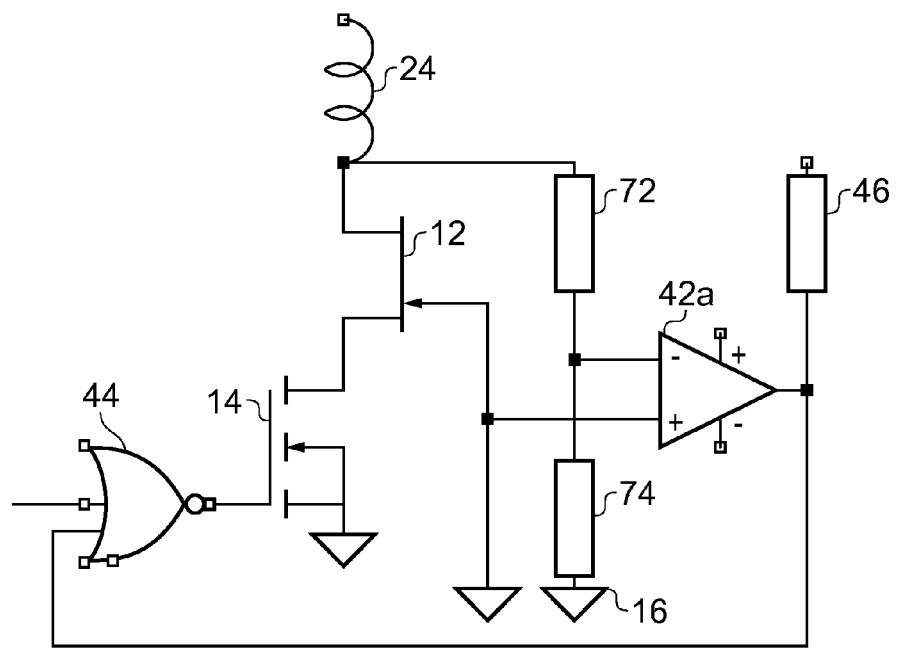
FIG. 7 shows a circuit diagram according a further embodiment It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

Another embodiment of the invention is shown in FIG. 7. The circuit shown in FIG. 7 is generally similar to that shown in FIG. 4, but in this embodiment the comparator 42 does not detect a negative voltage at the drain of the FET 14, Rather, a comparator 42a detects the voltage at the drain of the HEMT 12. To do so, whereas the positive input to the comparator 42a is connected to ground 16 as in the embodiment shown in FIG. 4, the negative input is connected to the mid-point of a voltage divider formed by resistor 72 and 74, which voltage divider is connected between the drain of the HEMT 12 and ground 16. The voltage divider 72 and 74 is provided to reduce the voltage at the comparator input. In this embodiment, similar to that described with reference to FIG. 4, the comparator detects a negative voltage, in this case the voltage at the drain of the HEMT, and switches on the FET in response to that negative voltage, in order to prevent currents through the gate of the HEMT. It will be appreciated, that this embodiment involves a loss due to the current through the voltage divider.

In a less preferred embodiment but one which avoids losses in a voltage divider, the negative input of the comparator 42a is connected directly to the drain of the HEMT. However, this would require that the comparator be able to withstand the potentially high voltages achievable at the drain of the HEMT, which may be for instance up to 650 V.

It will be appreciated that the invention is not limited to the circuit described above, but for example may be used in other power converters such as resonant converters. Furthermore, the invention is not limited to switch mode power converters may but may also be applied in other applications where a normally off power switch is require, such as without limitation motor drives, synchronous rectifiers, etc.

From reading the present disclosure, other variations and modifications will be apparent to the skilled person. Such variations and modifications may involve equivalent and other features which are already known in the art of cascade configurations for power switches, and which may be used instead of, or in addition to, features already described herein.

In particular, the normally-off switch in the cascode arrangement has been described above as being a field effect transistor. Other normally switches also fall within the scope of the invention, such as without limitation bipolar transistor and heterojunction bipolar transistors (HBT).

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A circuit arrangement comprising:
   a normally-on transistor having first and second transistor main terminals and a non-insulated control terminal,
   the non-insulated control terminal being electrically coupled to a ground;
   a normally-off switch having first and second switch main terminals and a switch control terminal,
   the normally-off switch being arranged in a cascode configuration with the normally-on transistor,
   the first switch main terminal being electrically coupled to the second transistor main terminal, the second switch main terminal being electrically coupled to the ground; and a control circuit configured to switch on the normally-off switch in response to the voltage at a transistor main terminal being negative relative to the ground.

2. The circuit arrangement of claim 1, wherein
The control circuit comprises a detector and an actuator,
The detector being for detecting the voltage at the transistor main terminal relative to the ground,
and the actuator being to provide a control signal to the switch control terminal to turn on the normally-off switch in response to detector detecting that the voltage at the transistor main terminal is negative relative to the ground.

3. The circuit arrangement of claim 1, wherein the control circuit is configured to switch on the normally-off switch in response to the voltage at the second transistor main terminal being negative relative to the ground.

4. The circuit arrangement of claim 1, wherein the control circuit is configured to switch on the normally-off switch in response to the voltage at the first transistor main terminal being negative relative to the ground.

5. The circuit arrangement of claim 1, further comprising a logic circuit arranged to provide a signal to the switch control terminal, the signal being a logical 'OR' of the control signal and a periodic drive signal.

6. The circuit arrangement of claim 5, configured for use in a switch mode power supply, wherein the periodic drive signal controls the switch mode power supply.

7. The circuit arrangement of claim 1, wherein the normally-on transistor is a high electron mobility transistor.

8. The circuit arrangement of claim 7, wherein the high electron mobility transistor is a GaN high electron mobility transistor.

9. The circuit arrangement of claim 1, wherein the normally-off switch is a field effect transistor.

10. A protection circuit for a normally-on transistor in a cascode configuration with a normally off FET switch, the protection circuit comprising a detector for detecting if the drain of the switch is negative relative to its source;

and a control element for switching on the FET in response to the detector detecting that the drain of the switch is negative relative to its source.

11. A method of controlling a cascode switch comprising:

a normally-on transistor having first and second transistor main terminals and a non-insulated control terminal, the non-insulated control terminal being electrically coupled to a ground, and a normally-off switch having first and second switch main terminals and a switch control terminal, the normally-off switch being arranged in a cascode configuration with the high electron mobility transistor, the first switch main terminal being electrically coupled to the second HEMT main terminal, the second switch main terminal being electrically coupled to the ground;

the method comprising detecting whether the voltage at a transistor main terminal is negative relative to the ground, and switching on the normally-off switch in response to the voltage at the transistor main terminal being negative relative to the ground.

* * * * *